United States Patent
Zimmer et al.

(10) Patent No.: US 7,232,498 B2
(45) Date of Patent: Jun. 19, 2007

(54) TIRE WITH RAISED INDICIA

(75) Inventors: Rene Jean Zimmer, Howald (LU);
Claude Ernest Felix Boes, Erpeldange (LU); Rene Francois Reuter, Burden (LU); Hans-Bernd Fuchs, Konz (DE); Wolfgang Albert Lauer, Mersch (LU); David John Zanzig, Bertrange (LU)

(73) Assignee: The Goodyear Tire & Rubber Company, Akron, OH (US)

( * ) Notice: Subject to any disclaimer, the term of this patent is extended or adjusted under 35 U.S.C. 154(b) by 126 days.

(21) Appl. No.: 10/917,738

(22) Filed: Aug. 13, 2004

(65) Prior Publication Data

US 2006/0032569 A1    Feb. 16, 2006

(51) Int. Cl.
*B29D 30/72*   (2006.01)
*B60C 13/00*   (2006.01)

(52) U.S. Cl. .................. 156/116; 152/523; 152/524

(58) Field of Classification Search ........ 152/DIG. 12, 152/523, 524; 156/116
See application file for complete search history.

(56) References Cited

U.S. PATENT DOCUMENTS

| | | | |
|---|---|---|---|
| 3,646,169 A | 2/1972 | Wirth | |
| 4,060,031 A | 11/1977 | Philipp | 101/163 |
| 4,444,607 A | 4/1984 | Lash et al. | 156/58 |
| 4,461,795 A * | 7/1984 | Ogawa | 428/66.5 |
| 4,669,517 A | 6/1987 | Krishnan | 152/209 |
| 4,823,856 A | 4/1989 | Roberts | 152/523 |
| 5,142,976 A | 9/1992 | Roulleau | 101/41 |
| 5,277,742 A * | 1/1994 | Scheurer | 156/397 |
| 5,296,077 A * | 3/1994 | Bohm et al. | 156/395 |
| 5,300,164 A | 4/1994 | DeTrano et al. | 156/116 |
| 5,303,758 A | 4/1994 | Clementz et al. | 152/523 |
| 5,466,424 A | 11/1995 | Kusana et al. | 422/186.05 |
| 5,478,426 A | 12/1995 | Wiler et al. | 156/272.8 |
| 5,523,273 A | 6/1996 | McQuaide | 203/227 |
| 5,603,796 A | 2/1997 | Baker | 156/272.8 |
| 5,639,414 A * | 6/1997 | Unseld | 264/402 |
| 5,645,661 A | 7/1997 | Clementz et al. | 152/523 |
| 5,807,446 A | 9/1998 | Ratliff, Jr. | 152/523 |
| 5,902,441 A | 5/1999 | Bredt et al. | 156/284 |
| 5,964,969 A | 10/1999 | Sandstrom et al. | 152/524 |

(Continued)

FOREIGN PATENT DOCUMENTS

| | | | |
|---|---|---|---|
| EP | 0249918 | * | 12/1987 |
| EP | 1077394 | | 2/2001 |
| JP | 01011824 | | 1/1989 |
| JP | 4-121205 | * | 4/1992 |
| JP | 5-104541 | * | 4/1993 |
| WO | 0053398 | | 9/2000 |

OTHER PUBLICATIONS

European Search Report.
*The Chemistry of Synthetic Dyes*, vols. I and II, K. Venkaktaraman. Academic Press, Inc. (New York, 1952).
*Organic Chemistry*, "Synthetic Dyes", pp. 702-725. W.T. Caldwell. Houghton Mifflin Company (1943).

Primary Examiner—Justin R. Fischer
(74) Attorney, Agent, or Firm—John D. DeLong

(57) ABSTRACT

The present invention provides a pneumatic tire comprising raised indicia on a sidewall of the tire, the raised indicia comprising a plurality of superposed layers of a curable elastomer composition.

11 Claims, 2 Drawing Sheets

U.S. PATENT DOCUMENTS

| | | |
|---|---|---|
| 6,013,153 A | 1/2000 | Koinuma et al. .......... 156/272.6 |
| 6,165,406 A | 12/2000 | Jang et al. ................... 264/308 |
| 6,207,077 B1 | 3/2001 | Burnell-Jones ......... 252/301.36 |
| 6,259,962 B1 | 7/2001 | Gothait ........................ 700/119 |
| 6,279,633 B1 | 8/2001 | Corvasce ..................... 152/525 |
| 6,295,737 B2 | 10/2001 | Patton et al. ................. 33/18.1 |
| 6,569,373 B2 | 5/2003 | Napadensky ................ 264/401 |
| 6,578,276 B2 | 6/2003 | Patton et al. ................. 33/18.1 |
| 6,610,429 B2 | 8/2003 | Bredt et al. ................. 428/703 |
| 6,644,763 B1 | 11/2003 | Gothait ........................... 347/1 |
| 6,652,943 B2 | 11/2003 | Tukachinsky et al. ... 428/36.91 |
| 6,658,314 B1 | 12/2003 | Gothait ........................ 700/119 |
| 2002/0016386 A1 | 2/2002 | Napadensky ................ 523/201 |
| 2002/0171177 A1 | 11/2002 | Kritchman et al. ......... 264/401 |
| 2003/0151167 A1 | 8/2003 | Kritchman et al. ......... 264/401 |
| 2003/0207959 A1 | 11/2003 | Napadensky et al. ....... 522/183 |
| 2004/0144462 A1 | 7/2004 | Zanzig et al. ............... 152/151 |

\* cited by examiner

TIRE WITH RAISED INDICIA

BACKGROUND OF THE INVENTION

Pneumatic tires often desirably have indicial markings, such as trademarks or other markings. These indicia typically are formed directly into the rubber sidewall during the tire molding process. Thus, the indicia may be raised lettering or other shapes, and may be colored with white pigments or other colorants in the rubber compound.

White sidewall tires are very popular with car makers. Tires having other types of appliques on the sidewalls thereof, such as lettering, logos, decals, or bar codes and the like, are also very popular. However, the construction of tires having white sidewalls or decorative appliques on the sidewall thereof is a complicated procedure. It generally involves the co-extrusion of a black sidewall rubber with a white sidewall rubber and laminating a protective cover strip over the white rubber to form a sidewall preassembly. This tire sidewall preassembly is then applied in sequence with the other required tire components to the tire building drum to form a green or uncured tire. The green tire is then typically cured in a tire press, with the desired applique being formed by the grooves in the tire mold. After the tire has been cured, it is carefully ground and buffed to expose the decorative applique which was previously covered and protected by the cover strip.

Co-extrusion is a complicated process which involves the utilization of sophisticated equipment and a large number of profile dies. The grinding and buffing step which is required to remove the cover strip is also complicated and labor intensive. These additional steps, which are required in building tires having decorative appliques on a sidewall thereof, adds significantly to the cost of building the tire.

In conventional white sidewall tires, the white rubber component represents a very substantial portion of the sidewall. However, it is desirable for tires to have thin sidewalls in order to attain desired performance characteristics. Accordingly, the decorative applique on the sidewall of a tire should be as thin as possible. Nevertheless, certain production and performance criteria has limited the degree to which the thickness of sidewall applique can be reduced.

There are additional problems associated with tires having decorative applique on a sidewall thereof which are built using standard techniques. For instance, such tires have more blemishes, imperfections, and voids in the sidewall area as compared to black sidewall tires. Additionally, problems associated with the white sidewall splice opening sometimes also occur. Misalignment of the white sidewall preassembly relative to mold grooves is a frequently-encountered problem which leads to blemished tires. The grinding procedure used in building standard tires having decorative appliques on a sidewall thereof sometimes leads to the formation of surface crack sites.

For the aforementioned reasons, tire having decorative appliques on a sidewall thereof and the conventional procedures used in building such tires leave much to be desired. To obviate these shortcomings associated with standard techniques for building tires having decorative appliques on a sidewall thereof, it has been proposed to replace the previously known sidewall decorative features with appliques which are painted on to conventional black wall tires. However, painting designs on to the sidewall of tires has not proven to be a satisfactory answer to the problem. This is largely due to the fact that designs which are painted on are quite thin and can be easily damaged by scraping, scuffing and the like.

The concept of applying premolded tire sidewall appliques to standard black wall tires has also been proposed. Difficulties have been encountered with maintaining adequate adhesion between the sidewall applique and the tire. Also, tires made utilizing such techniques typically have inferior scuff resistance such that the applique fails at the interface.

It is sometimes desired to apply indicia directly to an already molded and cured tire, typically on the sidewall area. To do this, various coatings and paints have been used to form indicia. However, poor adhesion or durability of the coatings usually leads to unacceptable performance of this type of indicia.

It would, therefore, be desirable to have a tire with indicia applied to a cured tire sidewall surface, wherein the indicial coating material offers good adhesion and durability.

SUMMARY OF THE INVENTION

The present invention provides a pneumatic tire comprising raised indicia on a sidewall of the tire, the raised indicia comprising a plurality of superposed layers of a curable elastomer composition.

DETAILED DESCRIPTION OF THE INVENTION

Figure 1:
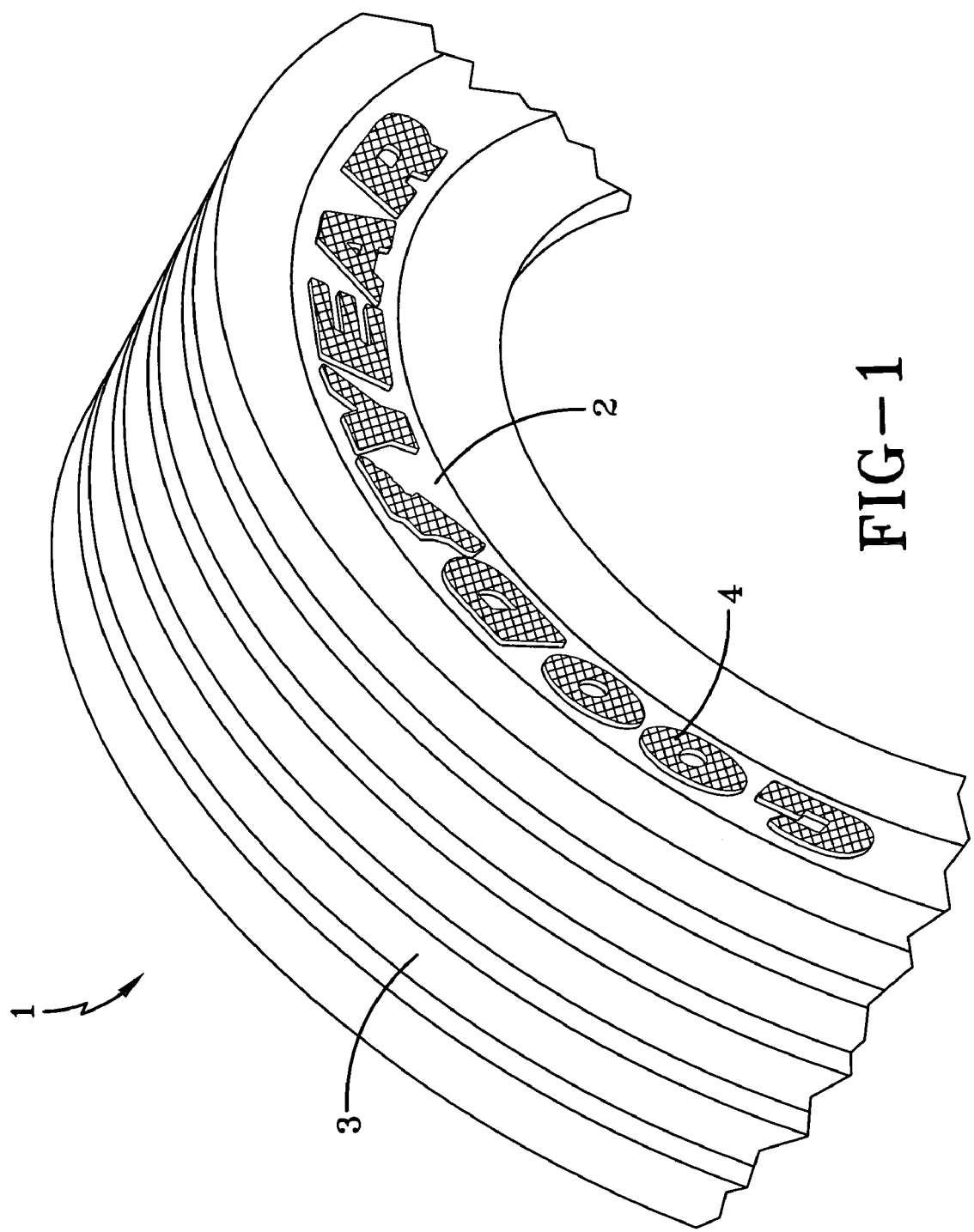
FIG. 1 depicts a perspective section of a sidewall (2) of tire (1).

The present invention provides a pneumatic tire comprising raised indicia on a sidewall of the tire, the raised indicia comprising a plurality of superposed layers of a curable elastomer composition.

The pneumatic tire having raised indicia may comprise any vehicle tire as is known in the art. In alternative embodiments, the tire may be any of passenger tires; light, medium or heavy truck tires, off-the-road tires, farm tires, mining tires, aircraft tires, motorcycle tires, and the like.

The pneumatic tire having raised indicia may have indicia applied to the tire sidewall in any desirable shape, such as lettering, trademark figures or logos, and the like. The indicia may also be in the shape or pattern of a sidewall stripe or stripes, such as for a white sidewall. Also envisioned as indicia are decorative markings, such as symbols, flowers, dots, short parallel and/or angled stripes or hash marks, or any other shapes as are desired by the user of the tire.

The indicia applied to the tire sidewall surfaces may be from a suitable material that will adequately adhere to the tire surface and suitably resist peeling, cracking, and sloughing from the tire. In one embodiment, the material is a elastomeric composition curable with conventional heat or radiation methods.

In one embodiment, the curable elastomeric composition includes a curable elastomer. The curable elastomer may include an ethylene-alpha-olefin rubber or elastomer. In addition to the ethylene-alpha-olefin rubber or elastomer, additional rubbers may be used. Generally speaking, from 50 to 100 parts by weight of the total rubber is an ethylene-alpha-olefin elastomer. Preferably, from 70 to 100 parts by weight is an ethylene-alpha-olefin elastomer. The ethylene-alpha-olefin elastomer includes copolymers posed of ethylene and propylene units (EPM), ethylene and butene units, ethylene and pentene units or ethylene and octene units (EOM) and terpolymers composed of ethylene and propylene units and an unsaturated component (EPDM), ethylene and butene units and an unsaturated component, ethylene and pentene units and an unsaturated component, ethylene and octene units and an unsaturated component, as well as mixtures thereof. As the unsaturated component of the terpolymer, any appropriate non-conjugated diene may be used including, for example, 1,4-hexadiene, dicyclopentadiene or ethylidenenorbornene (ENB). The ethylene-alpha-olefin elastomer preferred in the present invention contains from about 35 percent by weight to about 90 percent by weight of the ethylene unit, from about 65 percent by weight to about 5 percent by weight of the propylene or octene unit and 0 to 10 percent by weight of the unsaturated component. In a more preferred embodiment, the ethylene-alpha-olefin elastomer contains from about 50 percent to about 70 percent by weight of the ethylene unit and, in a most preferred embodiment, the ethylene-alpha-olefin elastomer contains from about 55 percent to about 65 percent of the ethylene unit. The most preferred ethylene-alpha-olefin elastomer is EPDM.

In one embodiment, the curable elastomer is ethylene propylene diene rubber (EPDM). Suitable EPDM comprise interpolymerized units of ethylene, propylene and diene monomers. Ethylene constitutes from about 63 weight percent to about 95 weight percent of the polymer, propylene from about 5 weight percent to about 37 weight percent, and the diene from about 0.2 weight percent to about 15 weight percent, all based upon the total weight of EPDM polymer. Preferably, the ethylene content is from about 70 weight percent to about 90 weight percent, propylene from about 17 weight percent to about 31 weight percent, and the diene from about 2 weight percent to about 10 weight percent of the EPDM polymer. Suitable diene monomers include conjugated dienes such as butadiene, isoprene, chloroprene, and the like; non-conjugated dienes containing from 5 to about 25 carbon atoms such as 1,4-pentadiene, 1,4-hexadiene, 1,5-hexadiene, 2,5-dimethyl-1,5-hexadiene, 1,4-octadiene, and the like; cyclic dienes such as cyclopentadiene, cyclohexadiene, cyclooctadiene, dicyclopentadiene, and the like; vinyl cyclic enes such as 1-vinyl-1-cyclopentene, 1-vinyl-1-cyclohexene, and the like; alkylbicyclononadienes such as 3-methylbicyclo-(4,2,1)-nona-3,7-diene, and the like, indenes such as methyl tetrahydroindene, and the like; alkenyl norbornenes such as 5-ethylidene-2-norbornene, 5-butylidene-2-norbornene, 2-methallyl-5-norbornene, 2-isopropenyl-5-norbornene, 5-(1,5-hexadienyl)-2-norbornene, 5-(3,7-octadienyl)-2-norbornene, and the like; and tricyclodienes such as 3-methyltricyclo (5,2,1,0.sup.2,6)-deca-3,8-diene and the like. More preferred dienes include the non-conjugated dienes. The EPDM polymers can be prepared readily following known suspension and solution techniques, such as those described in U.S. Pat. No. 3,646, 169 and in Friedlander, *Encyclopedia of Polymer Science and Technology*, Volume 6, Pages 338 through 386 (New York, 1967). The EPDM polymers are high molecular weight, solid elastomers. They typically have a Mooney viscosity of at least about 20, preferably from about 25 to about 150 (ML 1+8 at 125° C.) and a dilute solution viscosity (DSV) of at least about 1, preferably from about 1.3 to about 3 measured at 25° C. as a solution of 0.1 gram of EPDM polymer per deciliter of toluene. The raw polymers may have typical green tensile strengths from about 800 psi to about 1,800 psi, more typically from about 900 psi to about 1,600 psi, and an elongation at break of at least about 600 percent. The EPDM polymers are generally made utilizing small amounts of diene monomers such as dicyclopentadiene, ethylnorborene, methylnorborene, a non-conjugated hexadiene, and the like, and typically have a number average molecular weight of from about 50,000 to about 100,000.

In another embodiment, the EPDM is a viscous or wax-like, low molecular weight ethylene-propylene-nonconjugated diene terpolymers. They are polymerized randomly to produce liquid or wax-like elastomers with stable saturated hydrocarbon backbones. The molecular weight of the terpolymers will range generally from about 10,000 to 50,000 molecular weight, as measured by GPC (gel permeation chromatography) in THF at 35° C. using polystyrene standards. The ethylene/propylene ratio can range from about 20/80 to about 80/20 with a range of nonconjugated diene of from about 1 to 15 percent. The non-conjugated diene in a preferred embodiment will be selected from the group consisting of ethylidene norbornene (ENB) and dicyclopentadiene (DCPD). The low molecular weight liquid or wax-like EPDM is characterized by having a Brookfield viscosity at 60° C. (cps, RVT #7) within a range of about 300,000 to 1 million, preferably from about 400,000 to 1 million.

Suitable liquid EPDM include the Trilene® series of EPDM available from Crompton. Suitable liquid EPDM include Trilene® 67, a liquid EPDM polymer that has an Ethylene/Propylene ratio of 46/54 and contains 9.5 percent ENB by weight; Trilene® 65, a liquid EPDM polymer that has an Ethylene/Propylene ratio of 50/50 and contains 10.5 percent DCPD by weight; and Trilene® 77, with an Ethylene/Propylene ratio of 75/25 and contains 10.5 percent ENB by weight.

In another embodiment, Trilene® CP80, a liquid EPM that has an Ethylene/Propylene ratio of 43/57 and has a Brookfield viscosity of 500,000 cps at 60° C., may be used as an ethylene-alpha-olefin.

A co-agent may be present in the curable elastomer composition. Co-agents are monofunctional and polyfunctional unsaturated organic compounds which are used in conjunction with free radical initiators to achieve improved vulcanization properties. Representative examples include organic acrylates, organic methacrylates, divinyl esters, divinyl benzene, bis-maleimides, triallylcyanurates, high 1,2 vinyl polybutadiene, polyalkyl ethers and esters, metal salts of an alpha-beta unsaturated organic acid and mixtures thereof.

The co-agent may be present in a range of levels. Generally speaking, the co-agent is present in an amount ranging from 0.1 to 40 phr. Preferably, the co-agent is present in an amount ranging from 2 to 15 phr.

As mentioned above, one class of co-agents is acrylates and methacrylates. Representative examples of such co-agents include di-, tri-, tetra- and penta-functional acrylates, di-, tri-, tetra- and penta-functional methacrylates and mixtures thereof. Specific examples of such co-agents include 1,3-butylene glycol diacrylate, 1,3-butylene glycol dimethacrylate, 1,4-butanediol diacrylate, 1,4-butanediol dimethacrylate, 1,6 hexanediol diacrylate, 1,6 hexanediol dimethacrylate, 2-henoxyethyl acrylate, alkoxylated diacrylate, alkoxylated nonyl phenol acrylate, allyl methacrylate, caprolactone acrylate, cyclohexane dimethanol diacrylate, cyclohexane dimethanol, methacrylate diethylene glycol diacrylate, diethylene glycol dimethacrylate, dipentaerythritol pentaacrylate, dipropyleneglycol diacrylate, di-trimethylolpropane tetraacrylate, ethoxylated trimethylolpropane triacrylate, ethoxylated bisphenol A dimethacrylate, ethoxylated nonylphenol acrylate, ethoxylated tetrabromo bisphenol A diacrylate, ethoxylated bisphenol A diacrylate, ethoxylated bisphenol dimethacrylate, ethoxylated trimethylolpropane triacrylate, ethoxylated bisphenol A diacrylate, ethylene glycol dimethacrylate, glycidyl methacrylate, highly propoxylated glyceryl triacrylate, isobornyl acrylate, isobornyl methacrylate, isodecyl acrylate, isodecyl methacrylate, isooctyl acrylate, lauryl acrylate, methoxy polyethylene glycol monomethacrylate, methoxy polyethylene glycol monomethacrylate, neopentyl glycol diacrylate, neopentyl glycol dimethacrylate, octyldecyl acrylate, pentaacrylate ester, pentaerythritol tetraacrylate, pentaerythritol triacrylate, polyethylene glycol diacrylate, polyethylene glycol dimethacrylate, propoxylated glyceryl triacrylate, propoxylated neopentyl glycol diacrylate, propoxylated allyl methacrylate, propoxylated glyceryl triacrylate, propoxylated trimethylolpropane triacrylate, propoxylated trimethylolpropane triacrylate, stearyl acrylate, stearyl methacrylate, tetraethylene glycol diacrylate, tetraethylene glycol dimethacrylate, tetrahydrofurfuryl acrylate, tetrahydrofurfuryl methacrylate, tridecyl acrylate, tridecyl methacrylate, triethylene glycol diacrylate, triethylene glycol dimethacrylate, trifunctional acrylate ester, trifunctional methacrylate ester, trimethylolpropane triacrylate, trimethylolpropane triacrylate, trimethylolpropane trimethacrylate, tripropylene glycol diacrylate, tripropylene glycol diacrylate, tris(2-hydroxy ethyl)isocyanurate triacrylate, tris(2-hydroxy ethyl) isocyanurate triacrylate, tris(2-hydroxy ethyl)isocyanurate trimethacrylate, and high 1,2-vinyl polybutadiene.

In one embodiment, the co-agent is a high 1,2-vinyl polybutadiene. Suitable high 1,2-vinyl polybutadiene includes Ricon 154 available from Sartomer. Ricon 154 is a viscous liquid and is reported to have about 90 molar percent 1,2 vinyl units (QCS 642 method), a number average molecular weight of 5200 (QCS 650 method), and Brookfield viscosity of 250,000±50,000 cps at 45° C. (QCS 630 method).

The metal salts of .alpha., .beta.-unsaturated organic acids include the metal salts of acids including acrylic, methacrylic, maleic, fumaric, ethacrylic, vinyl-acrylic, itaconic, methyl itaconic, aconitic, methyl aconitic, crotonic, alpha-methylcrotonic, cinnamic and 2,4-dihydroxy cinnamic acids. The metals may be zinc, cadmium, calcium, magnesium, sodium or aluminum. Zinc diacylate and zinc dimethacrylate are preferred.

The curable elastomer composition may include a silica filler. Use of silica in the curable composition may give raised indicia with a greater resistance to cracking, as described in U.S. Pat. No. 6,279,633. The composition may further contain an organosilane coupling agent.

Other fillers may also be included in the curable elastomer composition including, but not limited to, calcium carbonate, titanium dioxide, alumina, and mica. To impart reflectivity to the raised indicia, reflective additives such as glass microbeads or glass nanobeads, small chopped glass fibers, metallic flakes or the like may be included in the curable elastomer composition.

When the curable elastomer composition is photocurable, the photocurable elastomer composition may contain a photoinitiator. Suitable photoinitiators include, but are not limited to, benzophenone, ortho- and para-methoxybenzophenone, dimethylbenzophenone, dimethoxybenzophenone, diphenoxybenzophenone, acetophenone, o-methoxy-acetophenone, acenaphthenequinone, methyl ethyl ketone, valerophenone, hexanophenone, alpha-phenylbutyrophenone, p-morpholinopropiophenone, dibenzosuberone, 4-morpholinobenzophonone, benzoin, benzoin methyl ether, 3-o-morpholinodeoxybenzoin, p-diacetylbenzene benzene, 4-aminobenzophenone, 4'-methoxyacetophenone, alpha-tetralone, 9-acetyl-phenanthrene, 2-acetyl-phenanthrene, 10-thioxanthenone, 3-acetyl-phenanthrene, 3-acetylindole, 9-fluorenone, 1-indanone, 1,3,5-triacetylbenzene, thioxanthen-9-one, xanthene-9-one, 7-H-benz[de]anthracen-7-one, benzoin tetrahydropyranyl ether, 4,4'-bis (dimethylamino)-benzophenone, 1'-acetonaphthone, 2'acetonaphthone, acetonaphthone and 2,3-butanedione, benz[a]anthracene-7,12-dione, 2,2-dimethoxy-2-phenylaceto-phenone, alpha, alpha-diethoxy-acetophenone, alpha, alpha-dibutoxyacetophenone, anthraquinone, isopropylthioxanthone and the like. Polymeric initiators include poly(ethylene/carbon monoxide), oligo[2-hydroxy-2-methyl-1-[4-(1-methylvinyl)-phenyl]propanone], polymethylvinyl ketone, and polyvinylaryl ketones. Use of a photoinitiator is preferable in combination with UV irradiation because it generally provides faster and more efficient crosslinking.

Preferred photoinitiators that are commercially available include benzophenone, anthrone, xanthone, and others, the Irgacure™ series of photoinitiators from Ciba-Geigy Corp., including 2,2-dimethoxy-2-phenylacetophenone (Irgacure™ 651); 1-hydroxycyclohexylphenyl ketone (Irgacure™ 184) and 2-methyl-1-[4-(methylthio)phenyl]-2-morpholino propan-1-one (Irgacure™ 907). The most preferred photoinitiators will have low migration from the formulated resin, as well as a low vapor pressure at extrusion temperatures and sufficient solubility in the polymer or polymer blends to yield good crosslinking efficiency. The vapor pressure and solubility, or polymer compatibility, of many familiar photoinitiators can be easily improved if the photoinitiator is derivatized. The derivatized photoinitiators include, for example, higher molecular weight derivatives of benzophenone, such as 4-phenylbenzophenone, 4-allyloxybenzophenone, allyloxybenzophenone, 4-dodecyloxybenzophenone and the like. The photoinitiator can be covalently bonded to the photocurable elastomer. The most preferred photoinitiators will, therefore, be substantially non-migratory from the packaging structure.

The photoinitiator is added in a concentration of from 0 to about 3 weight percent, preferably 0.1 to 2 weight percent of the photocurable elastomer.

The material used to form the indicia may comprise one or more colorants as are desired to impart a given color to the indicia on the tire. The color imparted by the colorants is not limited, and may include any color obtainable with known colorant additives. The colorants may include any suitable dyes, pigments, or the like that impart the desired color. The colorants may be included in the water or solvent-based coating liquid, or mixed with the coating liquid immediately prior to application to the tire. The relative amount of colorant to be added to the coating liquid is dependent on the type of colorant, the desired color, and the desired intensity of the color, as would be appreciated by one of skill in the art without undue experimentation.

Dyes are generally defined as compounds which contain groups that confer color, generally called chromophores. More information on dyes in general is available in *The Chemistry of Synthetic Dyes,* Volumes I and II by K. Venkaktaraman, 1952, published by Academic Press, Inc., New York, and in *Organic Chemistry by W. T. Caldwell,* 1943, published by Houghton Mifflin Company in its chapter entitled "Synthetic Dyes," Pages 702 through 725.

The curable elastomeric compositions used to form the indicia also may contain color pigments, including inorganic pigments, such as titanium dioxide, talc, mica, iron oxides, lead oxides, chromium oxides, lead chromate and carbon black, including conductive carbon black, and organic pigments such as phthalocyanine blue and phthalocyanine green, as well as a variety of other color pigments.

The curable elastomeric compositions may include phosphorescent or fluorescent agents, as disclosed in U.S. Pat. No. 6,207,077; fully incorporated herein by reference. Suitable phosphorescent and fluorescent agents as are known in the art may be used including, but not limited to, zinc sulfide phosphors and organic materials such as fluoranthene.

The curable elastomer composition may include other additives as are known in the rubber compounding art, for example, curatives, processing aids, fillers, antidegradants, etc. When used as a liquid as with an inkjet application, the curable elastomer composition may include viscosity modifiers to obtain a viscosity suitable for use in an inkjet, for example, organic solvents, plasticizers, etc. Mixing of the various components of the curable elastomer composition may be done using any of the various methods as are known in the art, including mixing in a Banbury type mixer, dry mixing, extrusion, etc. The curable elastomer composition may be applied at room temperature, or at an elevated temperature sufficient to impart a viscosity suitable for use in an inkjet.

The curable elastomer composition used to form the raised indicia is applied to a sidewall surface of a tire by any method involving a sequential application of layers of the elastomer composition to the sidewall. Suitable methods includes those commonly used in the art of rapid prototyping, including selective laser sintering, stereolithography, three-dimensional printing, and the like. A useful review of rapid prototyping techniques is given in U.S. Pat. No. 6,165,406. In one embodiment, a three-dimensional printing method is used to apply sequential layers of a curable elastomer composition to form raised indicia on a tire sidewall.

In one embodiment, the method involves applying raised indicia to a sidewall surface of a pneumatic tire, wherein the raised indicia have a raised thickness measured normal to the sidewall surface and an indicial cross-section substantially perpendicular to said normal, comprising the steps of preparing said sidewall surface of said tire to accept said raised indicia; applying a plurality of superposed layers of a curable elastomer composition to said prepared sidewall surface to form said raised indicia, each of said layers having a cross-section substantially similar to said indicial cross-section; and curing the curable elastomer composition by application of heat or electromagnetic radiation.

The raised indicia may be applied to the tire sidewall using apparatus as described in any of U.S. Pat. Nos. 6,165,406; 6,259,962; 6,658,314; any 6,644,763; fully incorporated herein by reference. Generally, a suitable apparatus may include a printing head having a plurality of inkjet nozzles, at least one dispenser connected to the printing head for selectively dispensing the curable elastomer composition in layers and curing means for optionally curing each of the layers deposited. The depth of each deposited layer is controllable by selectively adjusting the output from each of the plurality of nozzles.

To promote adhesion of the applied raised indicia to the tire sidewall, the sidewall surface of the tire may require preliminary preparation prior to application of the curable elastomer composition. In one embodiment, the sidewall tire surfaces may be cleaned of dirt, oils, and other contaminants using an aqueous detergent solution or other cleaning material. Mold release agents such as silicone mold release agents that may interfere with adhesion may be removed using solvents such as alcohols and the like. The sidewall tire surfaces may further be prepared by application of a suitable primer material. In one embodiment, the external tire surface may be pretreated with a chlorinating agent such as sodium hypochlorite and hydrochloric acid, or with a cyanuric acid solution. One example of a chlorinating agent is commercially available under the tradename Chemlok® 7701. The primer may be applied to the sidewall surface by brushing, dipping, spraying, wiping, or the like, after which the primer is allowed to dry.

To further promote adhesion of the coating to the tire surface, the tire sidewall rubber may comprise particular agents that promote adhesion of the curable elastomer composition to the tire sidewall. One such approach is taught in U.S. Pat. No. 4,669,517; fully incorporated herein by reference, wherein it is disclosed to add at least one hydroxyl terminated diene polyol to the tire rubber compound to promote adhesion.

As a further way to promote adhesion, it may be desirable to use a tire produced without the use of silicone-type mold release agents. Such agents, as are typically used in manufacture of tires, may interfere with the adhesion of the elastomer coating.

As an alternative way to promote adhesion, the tire sidewall may be pretreated with a plasma or electron beam, as disclosed in U.S. Pat. Nos. 6,013,153 and 5,466,424.

In another embodiment, the tire sidewall may have a region of spaced apart ridges disposed in the sidewall rubber. A base layer of curable elastomer composition may be applied to the region of spaced apart ridges, in order to promote mechanical interlocking of the cured base layer with the tire sidewall. In this manner, the base layer of curable elastomer composition will at least partially fill the spaces between the ridges and provide a base upon which the subsequent first and additive layers of curable elastomer composition are applied. Upon cure, the curable elastomer composition in the base layer will mechanically interlock with the ridges and spaces to provide an improved adhesion of the raised indicia to the tire sidewall. Such ridges are as described in U.S. Pat. Nos. 5,645,661; 5,303,758; 5,807,446; and 4,823,856. In this embodiment, the ridges are disposed in the sidewall rubber during molding of the tire. The ridges are disposed such that each of a plurality of ridges are spaced relative to each adjacent ridge. The ridges may be disposed in any pattern suitable for molding, i.e., parallel ridges, concentric ridges, etc. The spacing of the ridges is such that the curable elastomer composition may at least partially fill the spaces between ridges and provide a mechanical interlock between the cured base layer and the tire sidewall.

In another embodiment, the tire sidewall may be roughened to promote mechanical interlocking of a cured base layer of curable elastomer composition with the tire sidewall. The tire sidewall may be roughened by abrading the sidewall surface with a suitable abrasive, such as sandpaper, wire brush, pumice stone, sand blasting, cryogenic blasting, and the like.

The tire sidewall surface to which the curable elastomer composition is applied may be flush with the remainder of the sidewall surface; that is, the sidewall surface region to which the curable elastomer composition is applied may form a continuous surface with the surrounding sidewall surfaces. Alternatively, the tire sidewall surface to which the curable elastomer composition is applied may be recessed from the surrounding sidewall surfaces. Alternatively, the tire sidewall surface to which the curable elastomer composition is applied may be raised from the surrounding sidewall surfaces. The sidewall surface geometry, whether flush, recessed, or raised, is generally determined during molding of the tire.

After any preliminary surface preparation and priming, the curable elastomer composition may be applied to the tire sidewall surface by one of the aforementioned methods. In one embodiment, the curable elastomer composition is sprayed onto the sidewall surface of the tire from a plurality of inkjet nozzles. The curable elastomer composition is applied in a manner sufficient to form the desired raised indicia.

For example, the tire may be mounted on a suitable support structure to stabilize the sidewall to be labeled. Using a word processing or graphics software package, for example, the areas of the sidewall are specified that are desired to be printed in raised indicia. Any other parameters related to the raised indicia are also specified, such as the height of the raised indicia, for example, 0.5 mm.

After receiving a print command, a process controller instructs a printing head having a plurality of inkjet nozzles to jet the curable elastomer composition onto the area of the sidewall selected for printing. This is achieved by extracting the curable elastomer composition from a material dispenser and selectively adjusting the output from each of the plurality of inkjet nozzles, to control the amount of material dispensed from each nozzle. The printing head will first deposit a first layer of curable elastomer composition, followed by several additional layers as needed to obtain the desired raised thickness of the raised indicia. The amount of material deposited will correspond to the area selected to receive the raised indicia and the height of the raised area relative to the sidewall on which the curable elastomer composition will be deposited. Application of the curable elastomer composition from the printing head may further be driven by a CAD type program describing the geometry of the tire. For example, a computer design file for a tire mold may be utilized to direct the print heads to compensate for the curvature of the tire sidewall when applying the layers of the raised indicia. Compensation for the non-planar tire sidewall surface may also be made following a method as described in U.S. Pat. Nos. 6,295,737 and 6,578,276.

The deposited layers are then cured by the application of heat, ultra violet (UV), infrared (IR) radiation, or microwave (RF) radiation from a thermal or radiant curing device in communication with the controller. Each layer may be cured after it is sprayed onto the sidewall or previous layer, or two or more layers may be cured together. If a viscosity modifier, such as an organic solvent, is used in the curable elastomer composition, it may be required to evaporate the solvent from the layer before application of radiation for curing. Evaporation may be accomplished by application of heat or simply by time delay between layer application and cure. In one embodiment, application of heat may be accomplished by use of a nozzle directing a stream of hot gas towards the layer. Alternatively, the heat may be applied radiantly.

The various layers of the raised indicia may be applied using the same curable elastomer composition, or varying compositions. For example, for raised indicia having color or other visual effects such as reflectivity or phosphorescence, only the final several applied layers may include a composition comprising the colorants or other visual enhancement additives. In this way, the use of costly additives may be reduced. Additionally, the final, top layers of curable elastomer may be translucent, to impart a glossy appearance and/or offer a protective coating to the indicia.

FIG. 1 shows a tire (1) with a sidewall portion (2) and tread portion (3). In the sidewall portion (2), raised indicia (4) in the form of yellow letters and wingfoot logo are formed by application of a curable elastomer composition in sequential layers to tire sidewall (2). The raised indicia yellow letters and wingfoot logo (4) are of a curable elastomeric composition as described herein.

The curable elastomer composition will generally resist cracking, peeling, and flaking from the surface of the tire. To aid in protection of the raised indicia from external effects such as abrasion and flexure, the raised indicia may include various protective features. In one embodiment, the raised indicia may be disposed in a recessed cavity in the sidewall. The cavity recess from the main sidewall surface may range from about 0.1 to 2 millimeters, or generally in the same range as the raised thickness of the raised indicia. Alternatively, the raised indicia may be disposed on the main sidewall surface, with protective rubber scuff ribs disposed around the periphery of the raised indicia. Such scuff ribs, having a thickness on the order of the raised thickness of the raised indicia, may be molded along with the tire sidewall during the tire molding process, as is known in the art.

Figure 2A:
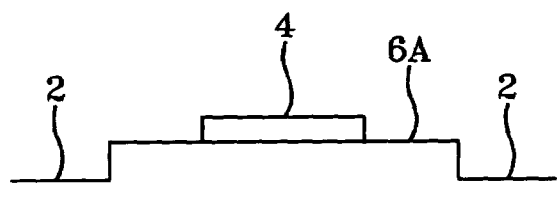
FIG. 2A–D each depict a cross section of an embodiment of sidewall (2).
Figure 2B:
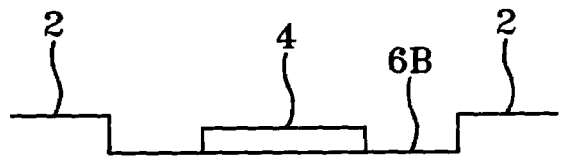
Figure 2C:
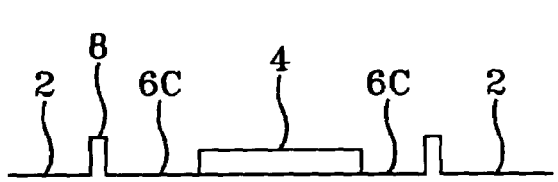
Figure 2D:
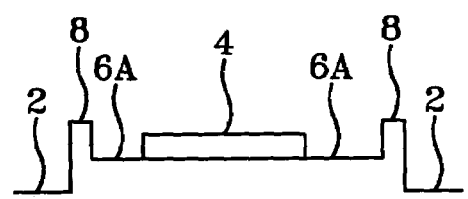

FIGS. 2A, B, C, D shows four embodiments for the cross section of the sidewall surface to which the curable elastomer composition may be applied as raised indicia. FIG. 2A shows an embodiment wherein indicia 4 is disposed on raised sidewall surface 6A; surface 6A is raised from the surrounding, proximal surface of sidewall portion 2. FIG. 2B shows an embodiment wherein indicia 4 is disposed on recessed sidewall surface 6B; surface 6B is recessed from the surrounding, proximal surface of sidewall portion 2. FIG. 2C shows an embodiment wherein scuff rib 8 is disposed on the tire sidewall portion 2. Scuff rib 8 surrounds sidewall surface 6C and provides scuff protection to the raised indicia 4 disposed on surface 6C. FIG. 2D shows an embodiment combining scuff rib 8 and raised area 6A.

To resist cracking due to flexure and the like, the raised indicia may be applied as a discontinuous image, with separations between regions to provide for discontinutities in stress transfer during flexure much in the way as separations in a ceramic tile floor prevent transmission of stress, and cracks, from tile to tile. For example, each layer may be applied as a discontinuous layer, with small separations between regions in a layer. Alternatively, the discontinuous application can be achieved by a pixel-like application of the lettering, symbols, sketches, etc., comparable to the rastering of images as known from newspapers. Each subsequent applied layer may have separations and regions corresponding to separations and regions of the previously applied layers. Alternatively, pre-existing rubber ribs molded into the tire sidewall may provide discontinuities to prevent stress transfer and cracking in the raised indicia. Layers of curable elastomer composition may be applied between and around the pre-existing rubber ribs, thus, resulting in raised indicia with rubber ribs interspersed in the image. The pre-existing rubber ribs may be the same as the spaced apart ridges useful for surface preparation, as described previously herein.

The thickness of the individual layers may range from about 0.1 to about 15 microns. Alternatively, the layer thickness may be from about 1 to about 10 microns. The raised thickness of the raised indicia may range from about 0.1 millimeters to about 2 millimeter, alternatively, from about 0.25 mm to about 1 mm.

While present exemplary embodiments of this invention and methods of practicing the same have been illustrated and described, it will be recognized that this invention may be otherwise variously embodied and practiced within the scope of the following claims.

What is claimed is:

1. A method of applying raised indicia to a sidewall surface of a pneumatic tire, said raised indicia having a raised thickness measured normal to said sidewall surface and an indicial cross-section substantially perpendicular to said normal, comprising the steps of:
   preparing said sidewall surface of said tire to accept said raised indicia;
   applying in a sequence of application steps each of a plurality of superposed layers of a curable elastomer composition to said prepared sidewall surface to form said raised indicia, each of said layers having a cross-section substantially similar to said indicial cross-section;
   wherein said sequence of application steps comprises:
   i) applying a first layer of said curable elastomer composition to said prepared sidewall surface;
   ii) applying an additional layer of said curable elastomer after applying the first layer, the additional layer superposing said first layer; and
   iii) applying at least one further additional layer after application of the previous layer such that each additional layer is superposed on the previously applied layer, until a predetermined raised thickness is obtained; and
   curing the curable elastomer composition by application of heat or electromagnetic radiation;
   wherein said step of applying a plurality of superposed layers of a curable elastomer composition comprises applying each of said layers of said curable elastomer composition from a plurality of inkjet nozzles.

2. The method of claim 1, wherein said step of curing the curable elastomer composition comprises:
   applying electromagnetic radiation to at least partially cure at least one applied layer of curable composition, said electromagnetic radiation selected from the group consisting of ultraviolet radiation, infrared radiation, visible light, microwave radiation, electron beam, and particle beam.

3. The method of claim 1, further comprising the step of applying a base layer of said curable elastomer composition onto said prepared sidewall surface prior to said step of applying said first layer.

4. The method of claim 1, wherein said prepared sidewall surface of said pneumatic tire comprises a plurality of spaced apart ridges, each ridge spaced relative to an adjacent ridge.

5. The method of claim 1, wherein said step of preparing said sidewall surface comprises a preparation method selected from the group consisting of roughening, chlorinating, plasma treatment, and ion beam treatment.

6. The method of claim 1, wherein said raised indicia are disposed on a sidewall surface selected from the group consisting of raised sidewall surfaces, recess sidewall surfaces, and flush sidewall surfaces.

7. The method of claim 1, wherein said sidewall surface comprises a rubber compound containing an adhesion promoter.

8. The method of claim 1, wherein said curable elastomer composition comprises:
   a curable elastomer; and
   a photoinitiator.

9. The method of claim 1, wherein said curable elastomer composition comprises an ethylene propylene diene rubber (EPDM).

10. The method of claim 8, wherein said curable elastomer composition further comprises silica.

11. The method of claim 8, wherein said curable elastomer composition further comprises at least one colorant selected from dyes, pigments, titanium dioxide, metal flakes, glass beads, glass fibers, phosphorescent agents, and fluorescent agents.

* * * * *